(12) United States Patent
Zhu et al.

(10) Patent No.: US 7,750,414 B2
(45) Date of Patent: Jul. 6, 2010

(54) STRUCTURE AND METHOD FOR REDUCING THRESHOLD VOLTAGE VARIATION

(75) Inventors: Huilong Zhu, Poughkeepsie, NY (US); Yanfeng Wang, Fishkill, NY (US); Daewon Yang, Hopewell Junction, NY (US); Huajie Chen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 12/128,772

(22) Filed: May 29, 2008

(65) Prior Publication Data

US 2009/0294923 A1    Dec. 3, 2009

(51) Int. Cl.
*H01L 31/062* (2006.01)
*H01L 21/336* (2006.01)

(52) U.S. Cl. .................... 257/381; 438/289

(58) Field of Classification Search .............. 438/174, 438/217, 276, 290; 257/390–391
See application file for complete search history.

(56) References Cited

U.S. PATENT DOCUMENTS

| 4,513,494 | A | * | 4/1985 | Batra ................. 438/217 |
| 6,815,272 | B2 | * | 11/2004 | Oda et al. .............. 438/158 |
| 7,271,044 | B2 | | 9/2007 | Speranza |
| 7,279,746 | B2 | | 10/2007 | Doris et al. |
| 7,282,425 | B2 | | 10/2007 | Koester et al. |

* cited by examiner

*Primary Examiner*—Calvin Lee
(74) *Attorney, Agent, or Firm*—Gibb I.P. Law Firm, LLC; Joseph Petrokaitis, Esq.

(57) ABSTRACT

A structure comprises at least one transistor on a substrate, an insulator layer over the transistor, and an ion stopping layer over the insulator layer. The ion stopping layer comprises a portion of the insulator layer that is damaged and has either argon ion damage or nitrogen ion damage.

2 Claims, 3 Drawing Sheets

STRUCTURE AND METHOD FOR REDUCING THRESHOLD VOLTAGE VARIATION

BACKGROUND

1. Field of the Invention

The embodiments of the invention generally relate to integrated circuit structures and methods and more particularly to a transistor structure that includes an ion stopping/gathering layer above the transistors.

2. Description of Related Art

Large threshold voltage variations have been found in transistor devices due to mobile ions moving into the devices. The embodiments described below provide a structure and method for reducing threshold voltage variation by reducing mobile ions diffusing into the transistor devices.

SUMMARY

One structure embodiment herein comprises at least one transistor on a substrate, an insulator layer over the transistor, and an ion stopping layer over the insulator layer. The ion stopping layer comprises a portion of the insulator layer that is damaged and has either argon ion damage or nitrogen ion damage.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
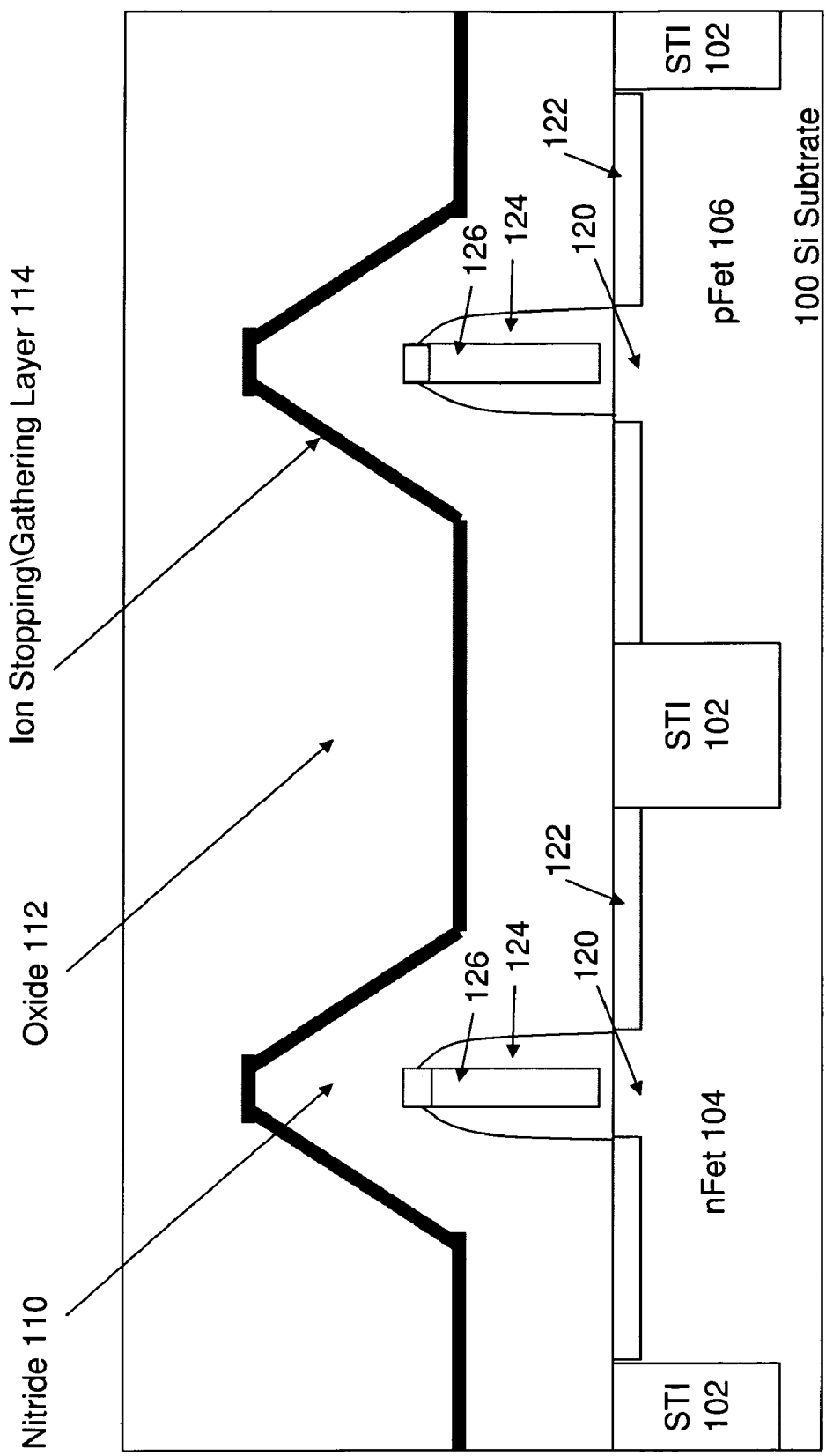
FIG. 1 is a schematic cross-sectional diagram of a transistor structure according to embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As shown in FIG. 1, one structure embodiment herein comprises at least one transistor 104/106 on a substrate 100. The substrate 100 can, for example, comprise a silicon substrate. In addition, the transistors can comprise negative-type field effect transistors (nFets 104) or positive-type field effect transistors (pFets 106). Regardless of the type of transistor, each will generally include a channel region 120, a gate conductor 126, sidewall spacers 124, and source and drain regions 122. While horizontal transistors are illustrated in the drawings, one ordinarily skilled in the art would understand that all types of transistors could be utilized with embodiments herein, including horizontal transistors, fin-type field effect transistors (FinFETs) etc. The transistors are isolated from one another using shallow trench isolation (STI) regions 102.

The details of the materials utilized and processes performed to create such transistors (e.g., complementarity metal oxide semiconductor (CMOS) transistors) are well known to those ordinarily skilled in the art and a detailed discussion of the same is not included herein. For examples of disclosures that include explanations of how such structures are formed, see U.S. Pat. Nos. 7,282,425; 7,279,746; and 7,271,044, the complete disclosures of which are incorporated herein by reference.

As shown in FIG. 1, at least one insulator layer 110 is formed over the transistors 104/106. In the example shown in FIG. 1, the lower insulator layer 110 comprises a nitride (although any suitable insulator material may be utilized).

Rather than forming a second insulator layer (oxide) 112 directly on the first insulator layer 110, embodiments herein form an ion stopping layer 114 over the first insulator layer. The ion stopping layer 114 comprises a portion of the first insulator layer 110 that is damaged (has either argon ion damage or nitrogen ion damage). The second insulator layer 112 is then formed over the ion stopping layer 114, the ion stopping layer 114 being between the insulator layer and the second insulator layer.

More specifically, in the embodiment shown in FIG. 1, the process starts with standard processing after CMOS transistors have been silicided and the nitride liner 110 has been formed on the top of the devices 104/106. Then, the embodiments herein use an $Ar/N_2$ plasma ion to sputter the top surface of the nitride liner 110 and form a thin damaged layer doped with $Ar/N_2$ 114. This ion stopping layer 114 can stop or gather mobile ion moving into the devices 104/106. After this, this embodiment uses conventional processing to deposit the oxide layer 112 and perform chemical mechanical polishing (CMP) to planarize the upper surface of the oxide 112. After this, conventional processes are followed to finish building the devices.

With respect to the $Ar/N_2$ plasma ions used to damage the surface of the insulators herein, argon and nitrogen can be used as sputtering source gases, with flow rates 230 sccm and 310 sccm respectively for 300 mm substrates, for example. During the sputtering process the substrate temperature can be about 400-420° C., and the process pressure can be less than 10 mTorr. The low frequency (LF RF) power can be 3600 W. The high frequency (HF) bias power can be 2000 W, supplied by an RF generator at 13.56 MHz, for example.

General process ranges which can be used for similar application are:

| Tool sets | Bias power (HF power) | LF power |
|---|---|---|
| HDP 300 mm system | 400-3000 W | 3000-4000 W |
| HDP 200 mm system | 200-2000 W | 1500-2000 W |

In this application, Ar and $N_2$ are ionized by inductively coupled plasma (LF RF) and accelerated (ion bombardment) by applied HF power toward the wafer (substrate) surface. The foregoing are only examples, and one ordinarily skilled in the art would understand that the sputter rate/amount depends on the applied bias power as well as the exposed materials.

Figure 2:
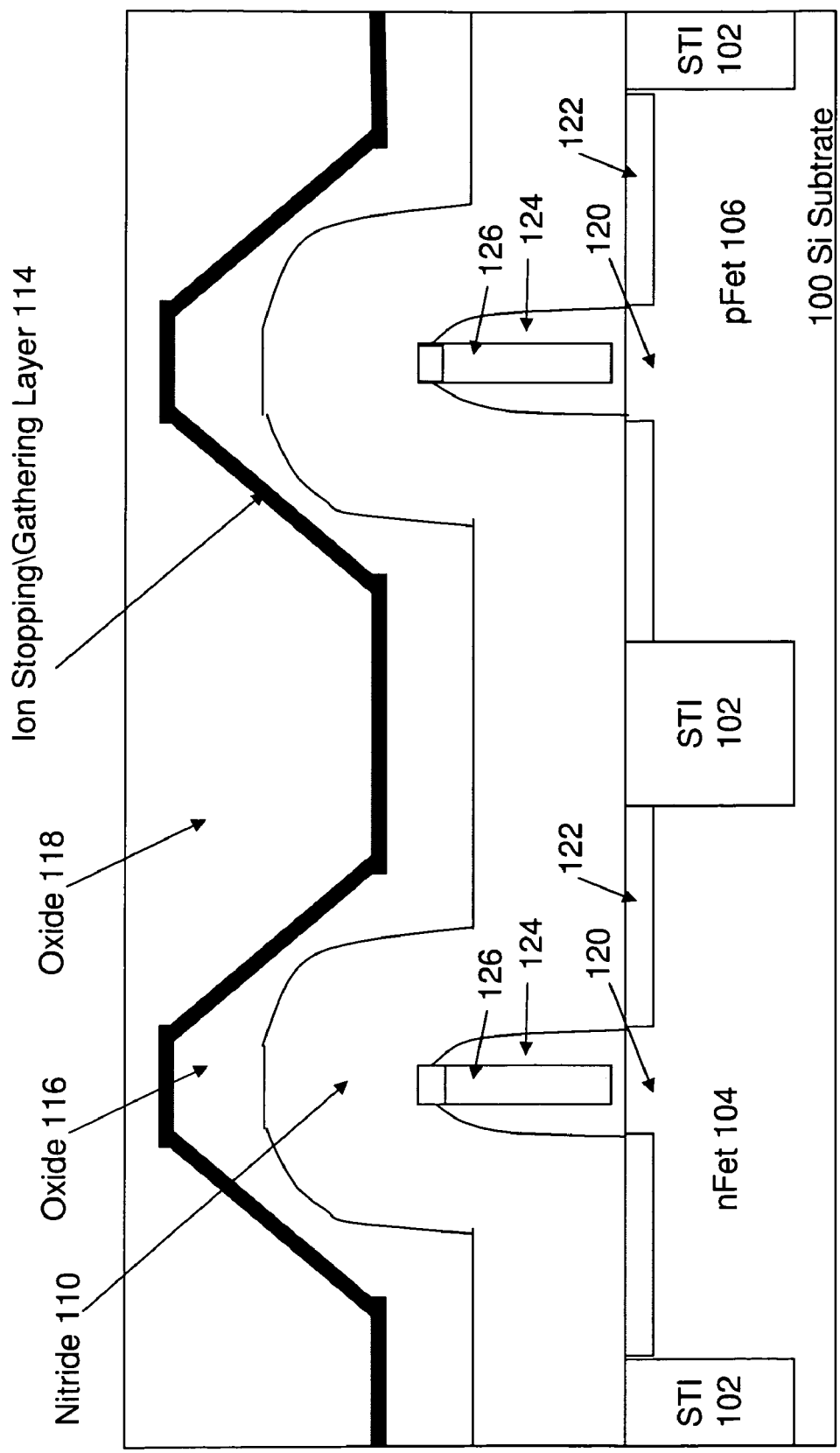
FIG. 2 is a schematic cross-sectional diagram of a transistor structure according to embodiments herein.

Therefore, the embodiment shown in FIG. 1 forms the ion stopping layer 114 between the nitride 110 and the oxide 112 layers. To the contrary, the embodiment shown in FIG. 2 forms of the ion stopping layer 114 within the oxide layer 112 (which is shown in FIG. 2 as items 116 and 118). Thus, in the embodiment shown in FIG. 2, there is a second insulator layer 116 below the ion stopping layer 114 and a third insulator layer 118 above the ion stopping layer 114. The second insulator layer is between the insulator layer and the ion stopping layer 114, and the ion stopping layer 114 is between the second insulator layer and the third insulator layer.

More specifically, in the embodiment shown in FIG. 2, the process also starts with standard processing after CMOS transistors have been silicided and the nitride liner 110 had been formed on the top of the devices 104/106. Then, a conformal oxide 116 is grown over the conformal nitride 110 to a height less than the full height of the oxide layer 112, illustrated FIG. 1. Then, this embodiment uses the Ar/$N_2$, plasma ions to sputter the top surface of the oxide layer 116 to form the thin damaged layer doped with Ar/$N_2$ 114. After this, this embodiment uses conventional processing to deposit the oxide layer 118 and perform chemical mechanical polishing (CMP) to planarize the upper surface of the oxide 112. After this, conventional processes are followed to finish building the devices.

Figure 3:
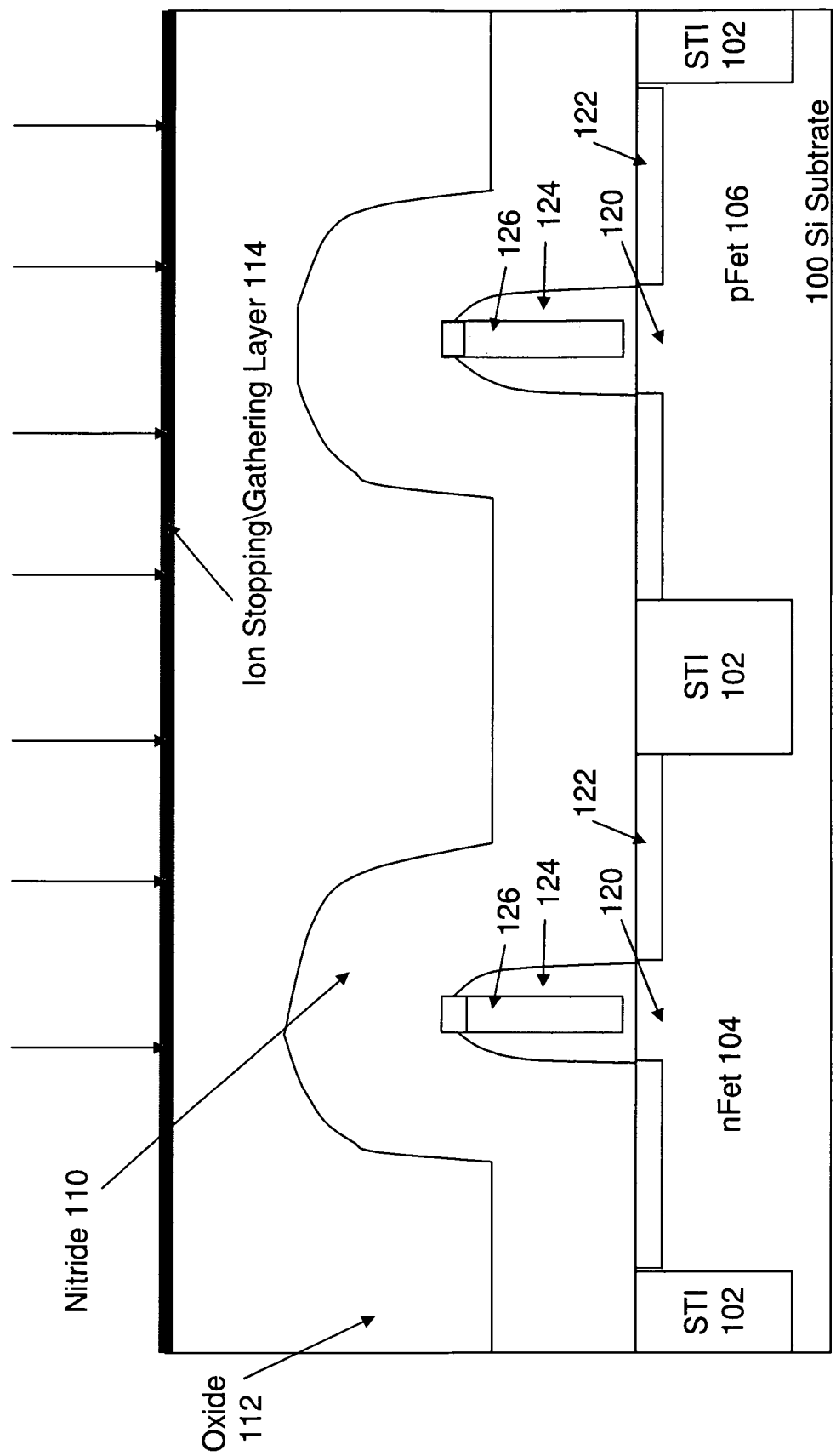
FIG. 3 is a schematic cross-sectional diagram of a transistor structure according to embodiments herein.

In the embodiment shown in FIG. 3, the process also starts with standard processing after CMOS transistors have been silicided and the nitride liner 110 had been formed on the top of the devices 104/106. Then, the conformal oxide 112 is grown over the conformal nitride 110. After this, this embodiment uses conventional processing to perform chemical mechanical polishing (CMP) to planarize the upper surface of the oxide 112. Then, this embodiment uses the Ar/$N_2$ plasma ion to sputter the top surface of the oxide 112 and form the thin damaged layer doped with Ar/$N_2$ 114. This layer 114 can stop or gather mobile ion moving into the device. After this conventional processes are followed to finish building the devices.

Therefore, as shown above, the embodiments herein provide a structure that shields the underlying transistors from mobile ions. More specifically, by including the ion stopping layer 114 within or above the insulator layer that is above the transistors, the transistors are protected from such mobile ions. Mobile ions have been shown to be a source of threshold voltage variation within transistor devices. Therefore, the embodiments described above provide a structure and method for reducing threshold voltage variation by reducing mobile ions diffusing into the transistor devices.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A structure comprising:
a substrate;
at least one transistor on said substrate;
an insulator layer over said transistor;
an ion stopping layer over said insulator layer;
a second insulator layer below said ion stopping layer; and
a third insulator layer above said ion stopping layer,
said second insulator layer being between said insulator layer and said ion stopping layer, and
said ion stopping layer being between said second insulator layer and said third insulator layer.

2. A structure comprising:
a substrate;
at least one transistor on said substrate;
an insulator layer over said transistor;
an ion stopping layer over said insulator layer, said ion stopping layer comprising a portion of said insulator layer having one of argon ion damage and nitrogen ion damage;
a second insulator layer below said insulator layer; and
a third insulator layer above said ion stopping layer,
said second insulator layer being between said insulator layer and said substrate, and
said ion stopping layer being between said insulator layer and said third insulator layer.

* * * * *